(12) United States Patent  (10) Patent No.: US 9,630,832 B2
Lin et al.  (45) Date of Patent: Apr. 25, 2017

(54) SEMICONDUCTOR DEVICE AND METHOD OF MANUFACTURING

(71) Applicant: TAIWAN SEMICONDUCTOR MANUFACTURING COMPANY, LTD., Hsinchu (TW)

(72) Inventors: Chin-Min Lin, Hsinchu (TW); Hsiang-Fu Chen, Zhubei (TW); Wen-Chuan Tai, Hsinchu (TW); Hsin-Ting Huang, Bade (TW); Chia-Ming Hung, Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/134,060

(22) Filed: Dec. 19, 2013

(65) Prior Publication Data
US 2015/0175406 A1 Jun. 25, 2015

(51) Int. Cl.
H01L 29/84 (2006.01)
B81B 7/00 (2006.01)

(52) U.S. Cl.
CPC ........ *B81B 7/007* (2013.01); *B81B 2207/015* (2013.01); *B81B 2207/095* (2013.01)

(58) Field of Classification Search
CPC ............ B81C 1/00269; B81C 1/00357; B81C 2203/0792; B81C 2203/0109; B81B 7/0032; B81B 2207/092
USPC ........................................................ 257/415
See application file for complete search history.

(56) References Cited

U.S. PATENT DOCUMENTS

| 6,902,656 | B2* | 6/2005 | Ouellet | B22F 1/0051 |
| | | | | 204/192.16 |
| 7,944,043 | B1* | 5/2011 | Chung et al. | 257/698 |
| 7,955,885 | B1* | 6/2011 | Bhugra et al. | 438/51 |
| 2008/0111223 | A1* | 5/2008 | Yu | H01L 23/3114 |
| | | | | 257/678 |
| 2008/0290433 | A1* | 11/2008 | Sanders et al. | 257/429 |
| 2008/0290490 | A1* | 11/2008 | Fujii et al. | 257/684 |
| 2010/0148341 | A1* | 6/2010 | Fuji | B81B 7/007 |
| | | | | 257/686 |
| 2011/0049652 | A1* | 3/2011 | Wu et al. | 257/417 |
| 2011/0133295 | A1* | 6/2011 | Fujii | G01P 15/0802 |
| | | | | 257/415 |
| 2011/0143476 | A1* | 6/2011 | Liu et al. | 438/51 |
| 2011/0163399 | A1* | 7/2011 | Witvrouw | B81C 1/00293 |
| | | | | 257/419 |
| 2011/0309486 | A1* | 12/2011 | Dalal | B81C 1/00333 |
| | | | | 257/678 |
| 2012/0248615 | A1* | 10/2012 | Chien | B81C 1/0023 |
| | | | | 257/770 |
| 2013/0043510 | A1 | 2/2013 | Shu et al. | |
| 2013/0049215 | A1* | 2/2013 | Larsen | 257/774 |
| 2013/0114228 | A1* | 5/2013 | Merz | H05K 1/0218 |
| | | | | 361/783 |

(Continued)

*Primary Examiner* — Andy Huynh
*Assistant Examiner* — Sitaramarao S Yechuri
(74) *Attorney, Agent, or Firm* — Hauptman Ham, LLP

(57) ABSTRACT

A semiconductor device includes a device substrate and a conductive capping substrate. The device substrate includes at least one micro-electro mechanical system (MEMS) device. The conductive capping substrate is bonded to the device substrate and includes a cap portion covering the MEMS device, and a conductor portion in electrical contact with the device substrate.

20 Claims, 7 Drawing Sheets

(56) References Cited

U.S. PATENT DOCUMENTS

2013/0214365 A1\* 8/2013 Schlarmann et al. ........ 257/415

\* cited by examiner

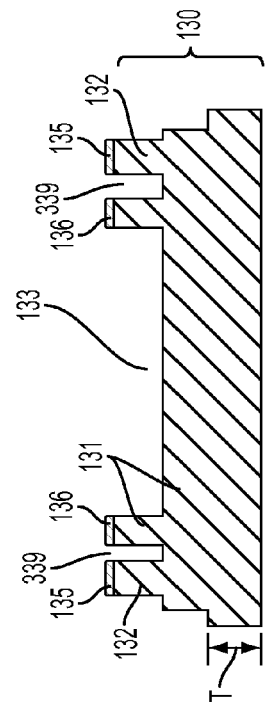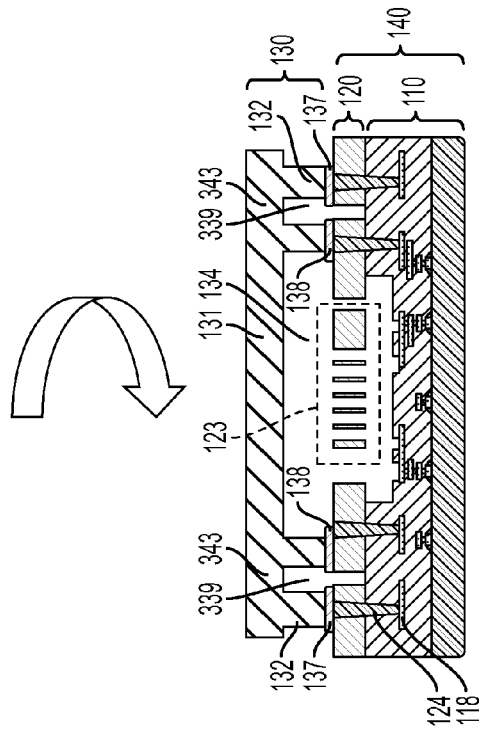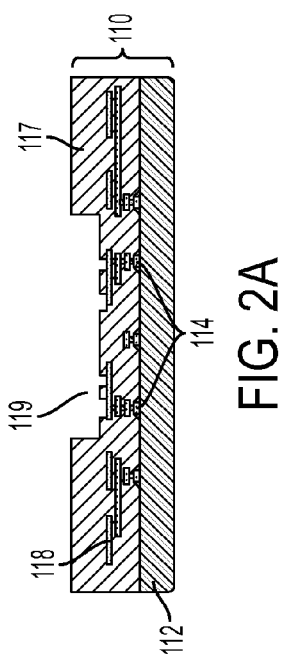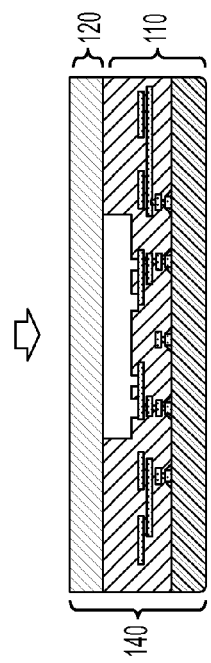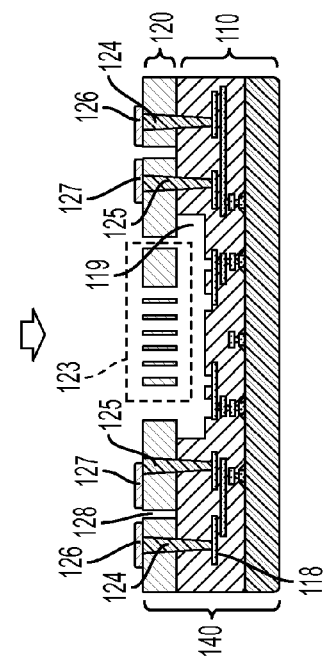

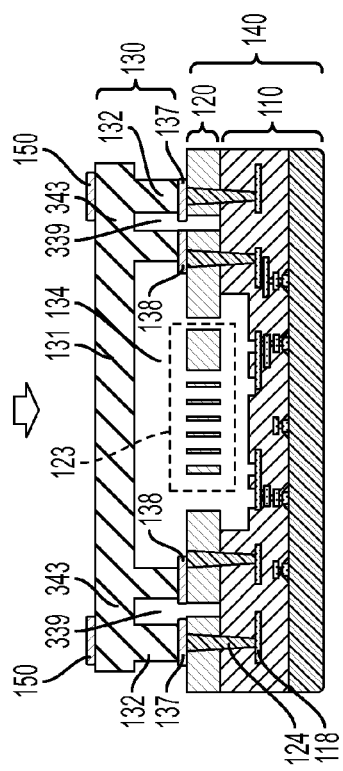
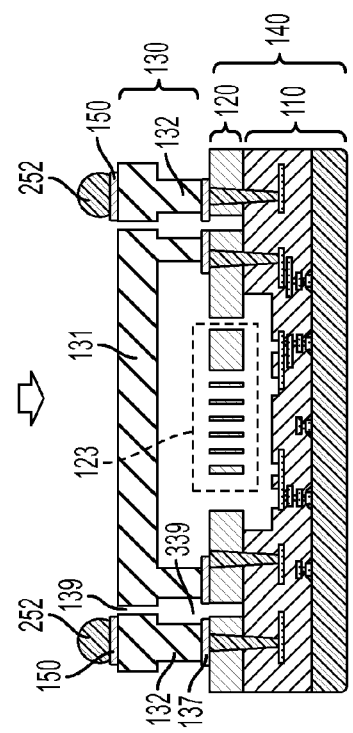

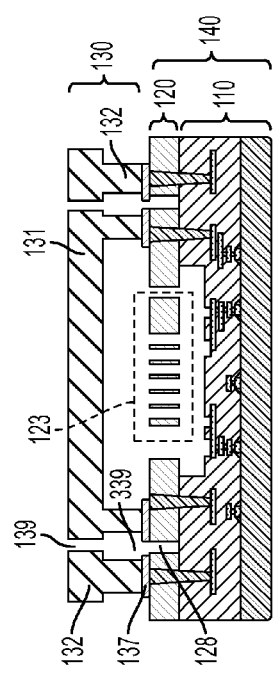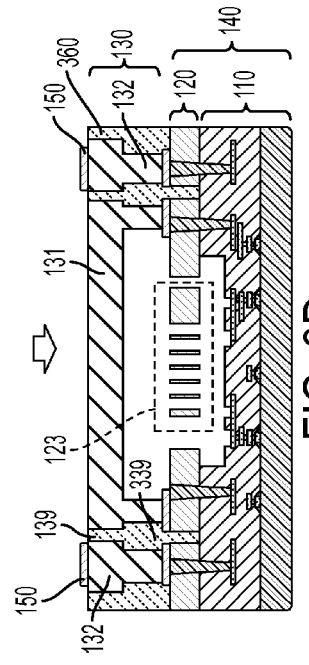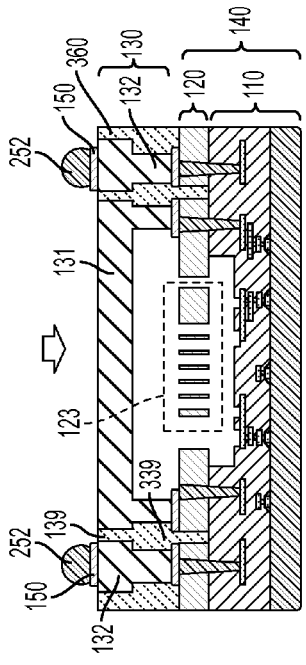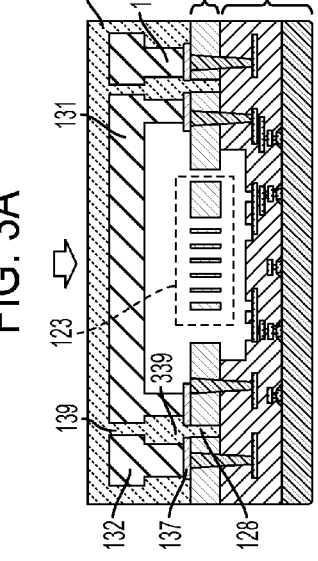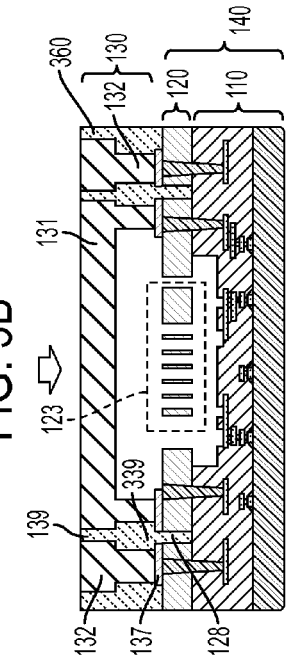
FIG. 3A
FIG. 3B
FIG. 3C
FIG. 3D
FIG. 3E

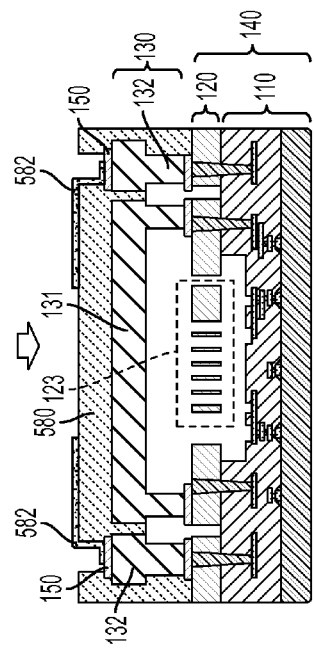
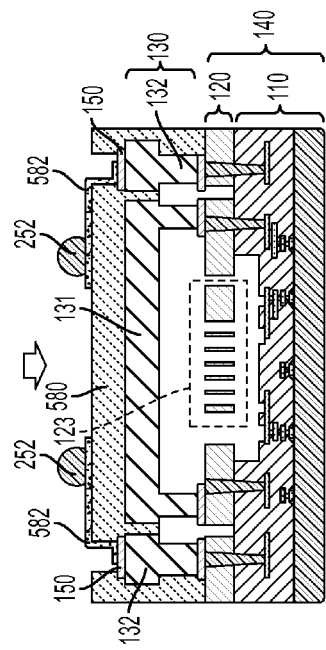
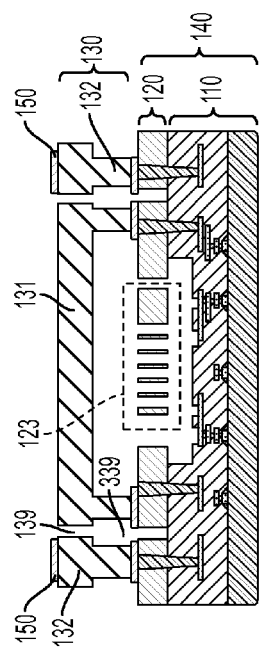
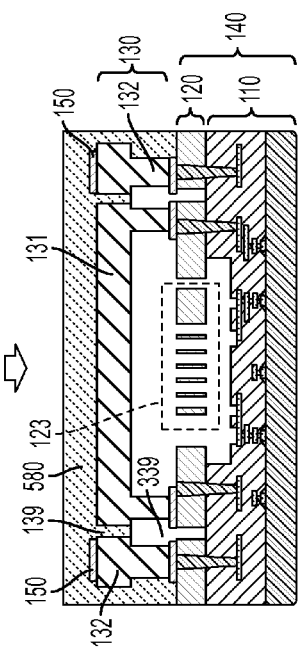
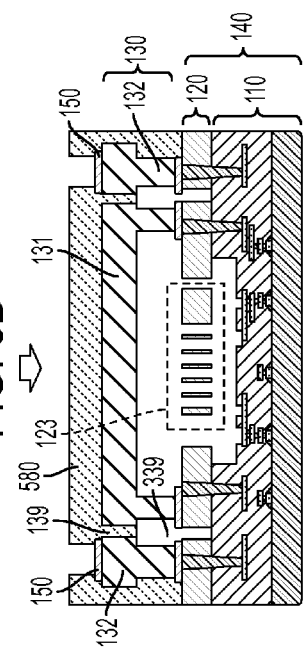

SEMICONDUCTOR DEVICE AND METHOD OF MANUFACTURING

BACKGROUND

Recent developments in the semiconductor integrated circuit (IC) technology include micro-electro mechanical system (MEMS) devices which include mechanical and electrical features formed by one or more semiconductor manufacturing processes. Examples of MEMS devices include micro-sensors, which convert mechanical signals into electrical signals, and micro-actuators, which convert electrical signals into mechanical signals. In semiconductor structures including MEMS devices, conductive features are provided to electrically connect the MEMS devices to external circuitry.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 2A-2G are schematic cross-sectional views of a semiconductor device at various stages during manufacture in accordance with some embodiments.

FIGS. 3A-3E are schematic cross-sectional views of a semiconductor device at various stages during manufacture in accordance with some embodiments.

FIGS. 5A-5E are schematic cross-sectional views of a semiconductor device at various stages during manufacture in accordance with some embodiments.

DETAILED DESCRIPTION

It is to be understood that the following disclosure provides many different embodiments or examples, for implementing different features of various embodiments. Specific examples of components and arrangements are described below to simplify the present disclosure. An inventive concept may; however, be embodied in many different forms and should not be construed as being limited to the embodiments set forth herein. It will be apparent; however, that one or more embodiments may be practiced without these specific details.

In some embodiments, a semiconductor device comprises a device substrate, and a conductive capping substrate bonded to the device substrate. The device substrate comprises at least one MEMS device. The conductive capping substrate comprises a cap portion covering the MEMS device. The conductive capping substrate further comprises a conductor portion in electrical contact with the device substrate. Compared to other approaches where through silicon vias (TSVs) are formed from a back side of the device substrate to provide electrical connections between the device substrate and external circuitry, at least one embodiment uses the conductor portion of the conductive capping substrate on the device substrate to make it possible to provide an electrical connection between the device substrate and external circuitry. As a result, one or more concerns associated with operation and/or manufacture of TSVs are avoidable in accordance with some embodiments.

Figure 1:
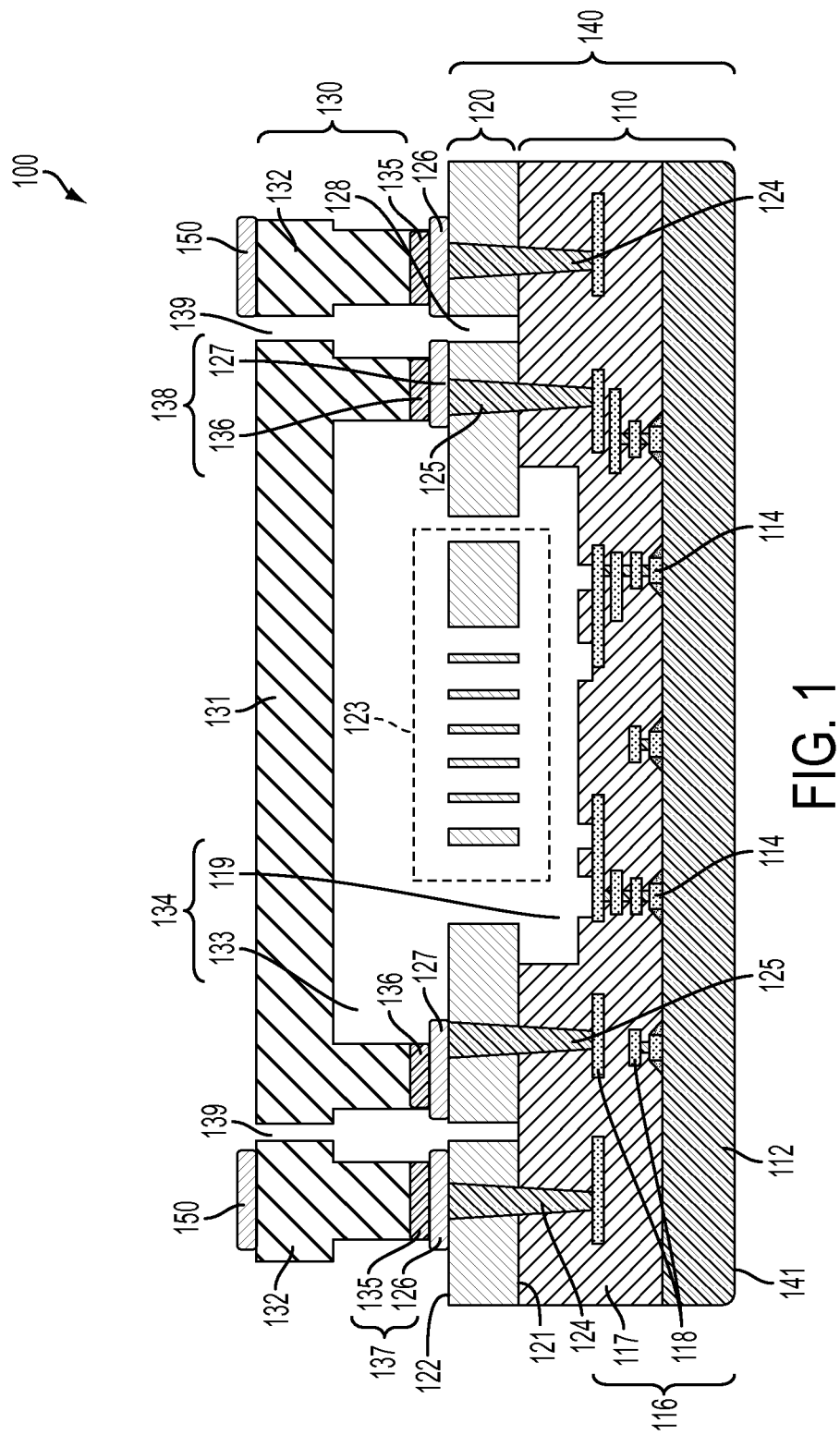
FIG. 1 is a schematic cross-sectional view of a semiconductor device in accordance with some embodiments.

FIG. 1 is a schematic cross-sectional view of a semiconductor device 100 in accordance with some embodiments. The semiconductor device 100 comprises a first substrate 110, a second substrate 120 and a third substrate 130 bonded to each other.

The first substrate 110 includes a wafer 112, one or more active elements 114 in the wafer 112, and an interconnect structure 116 over the wafer 112. In some embodiments, the wafer 112 includes an elementary semiconductor, a compound semiconductor, or an alloy semiconductor. Examples of elementary semiconductors include, but are not limited to, one or more of silicon and germanium. Examples of compound semiconductors include, but are not limited to, one or more of silicon carbide, gallium arsenide, gallium phosphide, indium phosphide, indium arsenide, and indium antimonide. Examples of alloy semiconductors include, but are not limited to, one or more of SiGe, GaAsP, AlInAs, AlGaAs, GaInAs, GaInP, and GaInAsP. In some embodiments, the wafer 112 includes a non-semiconductor material. Examples of non-semiconductor materials include, but are not limited to, one or more of glass, fused quartz, and calcium fluoride.

Examples of active elements 114 include, but are not limited to, transistors and diodes. Examples of transistors include, but are not limited to, one or more of metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains. In some embodiments, the first substrate 110 further comprises one or more passive elements. Examples of passive elements include, but are not limited to, one or more of capacitors, inductors, fuses, and resistors. In some embodiments, the active elements 114 include CMOS transistors or structures formed by CMOS processes, and the first substrate 110 is referred to as a CMOS substrate. In some embodiments, the first substrate 110 is free of active elements 114 and is referred to as a carrier substrate.

The interconnect structure 116 includes an inter-metal dielectric (IMD) material 117 and one or more conductive layers 118 in the IMD 117. Examples of IMD include, but are not limited to, one or more of silicon oxide, silicon nitride, silicon oxynitride, silicon carbide, silicon oxycarbide, low dielectric constant (low-k) dielectric material, ultra low-k dielectric material, and other dielectric materials. The conductive layers 118 are electrically coupled with each other through one or more vias. Examples of materials for the conductive layers 118 and/or vias include, but are not limited to, one or more of aluminum (Al), copper (Cu), tungsten (W), cobalt (Co), platinum (Pt), silicon (Si), germanium (Ge), titanium (Ti), tantalum (Ta), gold (Au), nickel (Ni), tin (Sn), doped polysilicon, and other suitable conductive materials. In some embodiments, the conductive layers 118 connect the active elements 114 and/or passive elements to define one or more ICs.

In some embodiments, the first substrate 110 includes a cavity 119 corresponding to a MEMS device of the second substrate 120 as described herein. In some embodiments, the cavity 119 is omitted.

The second substrate 120 includes a semiconductor material or a non-semiconductor material. Examples of semiconductor materials and non-semiconductor materials are given herein. In some embodiments, the second substrate 120 includes the same material as that usable for the wafer 112. In some embodiments, the second substrate 120 includes a material different from that of the wafer 112. The second substrate 120 has a first surface 121 bonded to the first substrate 110, and an opposite, second surface 122. The second substrate 120 includes at least one MEMS device 123 therein. In some embodiments, the MEMS device 123 includes a plurality of elements formed of metal, polysilicon, dielectric, and/or other materials used in CMOS fabrication processes. Examples of CMOS fabrication processes include, but are not limited to, one or more of photolithography, etching (e.g., wet etch, dry etch, plasma etch), deposition, plating, masking, patterning, and other suitable processes. The MEMS device 123 is configured depending on the intended functionality. Examples of MEMS devices include, but are not limited to, one or more of a motion sensor (e.g., a gyroscope, an accelerometer), a radio frequency (RF) MEMS device (e.g., an RF switch, filter), an oscillator, a MEMS microphone, micro mirror or any other MEMS structures. In at least one embodiment, the MEMS device 123 includes one or more moveable elements. In at least one embodiment, the MEMS device 123 includes one or more elements responsive to mechanical signals without being moveable.

The second substrate 120 is bonded to the first substrate 110 at the first surface 121 to form a device substrate 140 having the MEMS device 123 therein. The device substrate 140 has a back side 141 defined by a surface of the first substrate 110, and a front side define by the second surface 122 of the second substrate 120. Other arrangements for forming a device substrate having a MEMS device, without bonding two or more substrates, are within the scope of various embodiments.

In some embodiments, the first substrate 110 and the second substrate 120 are bonded together by a fusion bonding process. An example of fusion bonding process involves pressing the first substrate 110 and the second substrate 120 against each other and performing an annealing process to cause the first substrate 110 and the second substrate 120 to be bonded together due to atomic attraction forces. In at least one embodiment, a temperature of the annealing process is in a range from 500° C. to 1200° C. The fusion bonding process is applicable for $SiO_2$ to Si bonding, Si to Si bonding, and other suitable bonding. In one or more embodiments, $SiO_2$ to Si fusion bonding occurs between the IMD 117 made of $SiO_2$ and the second substrate 120 made of Si. In one or more embodiments, Si to Si fusion bonding occurs between an Si layer (not shown) formed on the IMD 117 and the second substrate 120 made of Si. Other bonding arrangements between the first substrate 110 and the second substrate 120 are within the scope of various embodiments. For example, in at least one embodiment, the first substrate 110 and the second substrate 120 are bonded together by an eutectic bonding process described herein.

A plurality of vias 124, 125 extend from the second surface 122, through the second substrate 120 into the first substrate 110 to be electrically connected to one or more of the conductive layers 118 of the interconnect structure 116. In at least one embodiment, the vias 124, 125 include W. A conductive layer over the second surface 122 is patterned into a plurality of bonding pads 126, 127. In at least one embodiment, the bonding pads 126, 127 include one or more of Al, Cu, Ti, Ta, Au, Ni, or Sn. At least one via and the corresponding bonding pad are configured for external electrical connections to external circuitry such as those described herein. For example, the via 124 and the corresponding bonding pad 126 over the via 124 are configured for an external electrical connection. At least one via and the corresponding bonding pad are configured for internal electrical connections. For example, the via 125 and the corresponding bonding pad 127 over the via 125 are configured for an internal electrical connection between the MEMS device 123 and one or more of the conductive layers 118. In some embodiments where the conductive layers 118 connect the active elements 114 to define one or more ICs, the MEMS device 123 is electrically connected to the one or more ICs by the corresponding via 125 and bonding pad 127.

A trench 128 extends from the second surface 122 into at least a thickness of the second substrate 120 to isolate a region corresponding to the internal electrical connections and the MEMS device 123 from a region corresponding to the external electrical connections. In some embodiments, the trench 128 extends through the second substrate 120 without extending into the first substrate 110. In some embodiments, the trench 128 extends into the first substrate 110. In some embodiments, the trench 128 is omitted.

The third substrate 130, also referred to as a capping substrate, is bonded to the second surface 122 of the second substrate 120, i.e., to the front side of the device substrate 140. The third substrate 130 comprises a cap portion 131 and at least one conductor portion 132. The cap portion 131 corresponds to and covers the MEMS device 123. The cap portion 131 has a cavity 133 which defines, together with the cavity 119 of the first substrate 110, a space 134 around the MEMS device 123 to permit movement of one or more moveable features of the MEMS device 123. In at least one embodiment, the space 134 includes vacuum to reduce resistance to movements of one or more moveable features of the MEMS device 123. In at least one embodiment, the space 134 is hermetically sealed by the bonding between the second substrate 120 and the third substrate 130. In at least one embodiment, the space 134 is not hermetically sealed.

The third substrate 130 is a conductive substrate and the conductor portion 132 of the third substrate 130 is configured, in some embodiments, to define an external electrical connection to external circuitry. Because the cap portion 131 and the conductor portion 132 include the same material of the third substrate 130, both mechanical strength of the cap portion 131 and conductivity of the conductor portion 132 are considerations, in accordance with some embodiments, for selecting a material for the third substrate 130. In at least one embodiment, to provide an intended conductivity of the conductor portion 132, the third substrate 130 is made of a material that has a resistance not greater than 1 milliohm-cm. When the resistance of the third substrate 130 is greater than 1 milliohm-cm, conductivity of the external electrical connections defined by the conductor portion 132 is decreased to a level potentially affecting signal quality. In at least one embodiment, to provide sufficient mechanical strength for the cap portion 131, the third substrate 130 is made of a material that has a Young modulus of at least 50 GPa. When the Young modulus of the third substrate 130 is less than 50 GPa, mechanical strength of the cap portion 131 in particular and/or the semiconductor device 100 as a whole is reduced to a level at which the semiconductor device 100 is potentially susceptible to damage during one or more manufacturing processes, such as thinning and packaging, which involve applications of mechanical forces to the semiconductor device 100. In at least one embodiment, the third substrate 130 is an Si wafer doped with p-dopants and/or n-dopants at a dopant concentration sufficient to reduce the resistance of the third substrate 130 to 1 milliohm-cm or below.

In some embodiments, the second substrate 120 and the third substrate 130 are bonded together by an eutectic bonding process. In some embodiments, an eutectic bonding involves a metal, unlike a fusion bonding which does not involve a metal. An example of eutectic bonding is a semiconductor-to-metal bonding between a semiconductor material and a metal material. In at least one embodiment, the semiconductor material involved in a semiconductor-to-metal bonding includes at least one of Ge, Si, SiGe, or another semiconductor material. In at least one embodiment, the metal material involved in a semiconductor-to-metal bonding includes at least one of Al, Cu, Ti, Ta, Au, Ni, Sn, or another metal. Another example of eutectic bonding is a metal-to-metal bonding between two metal materials each including at least one of Al, Cu, Ti, Ta, Au, Ni, Sn, or another metal. The materials to be bonded by an eutectic bonding process are pressed against each other in an annealing process to form an eutectic phase of the materials. For example, an eutectic binding between Ge and Al is formed at an annealing temperature in a range from 400° C. to 450° C.

In at least one embodiment, an eutectic bonding is effected between the bonding pads 126, 127 on the second substrate 120 and corresponding bonding layers 135, 136 on the corresponding cap portion 131 and conductor portion 132 of the third substrate 130. For example, the bonding pads 126, 127 include one or more metal materials suitable for an eutectic bonding, such as Al, Cu, Ti, Ta, Au, Ni, Sn, and other metals. The bonding layers 135, 136 include one or more of the metal materials and/or one or more semiconductor materials suitable for an eutectic bonding, such as Ge, Si, SiGe, and other semiconductor materials. The second substrate 120 and the third substrate 130 are pressed against each other and annealed, to form a bonding structure 137 between the bonding pad 126 and the bonding layer 135. Similarly, a bonding structure 138 is formed between the bonding pad 127 and the bonding layer 136. The bonding structure 137 physically and electrically connects the conductor portion 132 of the third substrate 130 to the device substrate 140. For example, the conductor portion 132 is electrically connected by the bonding structure 137 and the corresponding via 124 to one or more of the conductive layers 118. As a result, the conductor portion 132 is electrically connected to one or more ICs included in the first substrate 110 and/or the MEMS device 123 via the conductive layers 118 of the interconnect structure 116. The conductor portion 132 defines an external electrical connection for the MEMS device 123 and/or one or more ICs in the first substrate 110. The bonding structure 138 at least physically connects the cap portion 131 to the device substrate 140. In at least one embodiment, the bonding pad 127 forming the bonding structure 138 is not electrically connected to the conductive layers 118. As a result the conductive material of the cap portion 131 is electrically isolated from the MEMS device 123 and/or one or more ICs included in the first substrate 110. Other bonding arrangements between the third substrate 130 and the device substrate 140 are within the scope of various embodiments.

The third substrate 130 further comprises a trench 139 formed between the cap portion 131 and the conductor portion 132. In at least one embodiment, the trench 139 physically and electrically isolates the conductor portion 132 from the cap portion 131. In at least one embodiment, the trench 139 is positioned corresponding to the trench 128 in the second substrate 120. A contact pad 150 is formed over the conductor portion 132 and configured for ball or wire bonding of the conductor portion 132 to external circuitry. In some embodiments, the contact pad 150 includes a layer of AlCu underlying a layer of TiN.

Compared to other approaches where TSVs are formed from a back side of a device substrate (e.g., from the back side 141 of the device substrate 140) to provide electrical connections between the device substrate and external circuitry, by using one or more conductor portions 132 of the conductive capping substrate 130 on the front side 122 of the device substrate 140 to provide electrical connections to external circuitry, some embodiments avoid or reduce one or more concerns associated with operation and/or manufacture of TSVs. For example, some other approaches involve forming low aspect ratio TSVs in a large plating area which, in turn, involve thinning the wafer of the CMOS substrate and/or increasing the TSV size with increased process difficulty. Further, one or more ICs included in the CMOS substrate in accordance with other approaches are potentially affected by the proximity and/or number and/or manufacture processes of the TSVs, with increased stress, thermal mismatch, plating defects, and leakage. In some embodiments, TSVs are not formed in the device substrate 140 from the back side 141, thereby one or more of the above described concerns associated with operation and/or manufacture of TSVs are avoidable. Additionally, various TSV processes, such as plating and grinding, are omitted in some embodiments, thereby reducing manufacturing complexity and/or cost and/or time.

In some embodiments, the conductor portions 132 are configured as pillars with a width smaller than a width of TSVs. In at least one embodiment, the conductor portions 132 have a width of 50 μm and smaller. Compared to other approaches where TSVs are formed with a width of at least 90 μm, such embodiments permit a greater number of input/outputs (I/Os) to be formed and/or permit increased flexibility in I/O arrangement within a preset die area.

FIGS. 2A-2G are schematic cross-sectional views of a semiconductor device at various stages during manufacture in accordance with some embodiments.

As shown in FIG. 2A, a first substrate 110 is prepared. For example, various active elements 114 (such as CMOS transistors) and interconnect features (such as conductive layers 118 and corresponding vias in an IMD 117) are formed over a wafer 112. A cavity 119 is formed in a top portion of the IMD 117 corresponding to a MEMS device that will be later positioned over the cavity 119. In at least one embodiment, the cavity 119 is formed by one or more of a wet etching process and a dry etching process.

As shows in FIG. 2B, a second substrate 120 is bonded to the first substrate 110 to form a device substrate 140. For example, the second substrate 120 is bonded to the first substrate 110 by a fusion bonding process. In at least one embodiment, a fusion bonding is achieved between, e.g., silicon oxide of the IMD 117 in the first substrate 110 and the silicon of the second substrate 120. In at least one embodiment, the second substrate 120 is thinned down to reduce the thickness thereof after fusion bonding with the first substrate 110. In at least one embodiment, the thinning down operation is omitted.

As shown in FIG. 2C, a MEMS device 123, vias 124, 125, bonding pads 126, 127 and a trench 128 are formed. For example, via holes for the vias 124, 125 are etched through the second substrate 120 and a thickness of the first substrate 110 to reach one or more of the conductive layers 118. A metal, e.g., W, is filled in the via holes to form the vias 124, 125 to be electrically connected to one or more of the conductive layers 118. A conductive layer, e.g., an AlCu layer, is deposited over the second substrate 120 and patterned to form bonding pads 126, 127 corresponding to the vias 124, 125. The MEMS device 123 is formed in the second substrate 120 by various processes including etching and lithography processes. In at least one embodiment, the trench 128 is formed simultaneously with the MEMS device 123 in the same etching and lithography processes.

As shown in FIG. 2D, a third substrate 130 is prepared. For example, the third substrate 130 includes a silicon substrate and is etched to form a cavity 133 of a cap portion 131, and a trench 339 between the cap portion 131 and one or more conductor portions 132. The conductor portions 132 are configured as Si pillars. Bonding layers 135, 136, of, e.g., Ge, are formed over the end faces of the corresponding conductor portions 132 and cap portion 131. In at least one embodiment, the bonding layer 136 on the third substrate 130 and the corresponding bonding pad 127 on the second substrate 120 are ring-shaped to hermetically seal the MEMS device 123 in the space 134 (FIG. 2E vide infra).

As shown in FIG. 2E, the third substrate 130 prepared in accordance with the operations described with respect to FIG. 2D is flipped over and bonded to the device substrate 140 prepared in accordance with the operations described with respect to FIG. 2C. For example, the bonding layers 135, 136 of the third substrate 130 are bonded by an eutectic bonding process to the corresponding bonding pads 126, 127 of the device substrate 140, resulting in bonding structures 137, 138. The bonding structure 138 physically and electrically connects the conductor portion 132 to one or more of the conductive layers 118 through the corresponding via 124. In at least one embodiment, the third substrate 130 is thinned down to remove a partial thickness T (best seen in FIG. 2D) after being bonded to the device substrate 140. A portion 343 of the third substrate 130 corresponding to the trench 139 (vide infra) remains between and connects the conductor portion 132 and the cap portion 131. One or more the operations described with respect to FIGS. 2A-2D are described in further detail in U.S. patent application Ser. No. 13/433,906, filed Mar. 29, 2012, which is incorporated by reference herein in its entirety.

As shown in FIG. 2F, contact pads 150 are formed over the conductor portions 132. For example, contact pads 150 include one or more of Al, Cu, Ti, Ta, Au, or Ni deposited by sputtering and subsequently patterned by etching. In some embodiments, the contact pad 150 includes a layer of AlCu underlying a layer of TiN.

The portion 343 connecting the cap portion 131 and the conductor portions 132 is removed to physically and electrically isolating the cap portion 131 and the conductor portions 132. For example, a trench 139 (FIG. 2G vide infra) is etched through the entire thickness of the portion 343 to reach the trench 339. As a result, a structure corresponding to the semiconductor device 100 described with respect to FIG. 1 is obtained.

As shown in FIG. 2G, solder balls 252 are formed over the corresponding contact pads 150, using a ball dropping or ball printing technique. In at least one embodiment, bonding wires are electrically connected to the contact pads 150 instead of solder balls 252.

FIGS. 3A-3E are schematic cross-sectional views of a semiconductor device at various stages during manufacture in accordance with some embodiments.

As shown in FIG. 3A, the operations described with respect to FIGS. 2A-2F are performed, except that the contact pads 150 are not yet formed. The obtained structure is then subject to the described trench etching in which the portion 343 connecting the cap portion 131 and the conductor portions 132 is removed to physically and electrically isolating the cap portion 131 and the conductor portions 132. As a result of the trench etching, a trench 139 is etched through the entire thickness of the portion 343 to reach the trench 339. The resulting structure is shown in FIG. 3A.

As shown in FIG. 3B, a molding compound 360 is deposited over the structure of FIG. 3A. In at least one embodiment, the molding compound 360 includes an epoxy material. In at least one embodiment, the molding compound 360 fills in one or more or all of the trenches 128, 339, and 139. The molding compound 360 is formed over and surrounds the cap portion 131 and conductor portions 132. In at least one embodiment, the molding compound 360 is formed by an injection molding process, As shown in FIG. 3C, a planarization or grinding operation is performed to remove the molding compound 360 over the cap portion 131 and the conductor portions 132, until at least the conductor portions 132 are exposed from the molding compound 360.

As shown in FIG. 3D, contact pads 150 are formed over the exposed conductor portions 132, as described herein with respect to FIG. 2F.

As shown in FIG. 3E, solder balls 252 and/or bonding wires are formed over the corresponding contact pads 150 of the conductor portions 132. Compared to the operations described with respect to FIGS. 2A-2G where a trench etching operation is performed to isolate the conductor portions 132 from the cap portion 131 after the formation of contact pads 150, the operations in accordance with some embodiments described with respect to FIGS. 3A-3E include the trench etching operation before forming contact pads 150.

FIGS. 4A-4F are schematic cross-sectional views of a semiconductor device at various stages during manufacture in accordance with some embodiments.

Figure 4A:
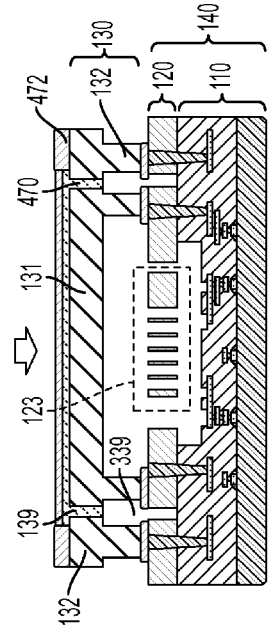
FIGS. 4A-4F are schematic cross-sectional views of a semiconductor device at various stages during manufacture in accordance with some embodiments.

As shown in FIG. 4A, a semiconductor structure is obtained as described with respect to FIG. 3A.

Figure 4B:
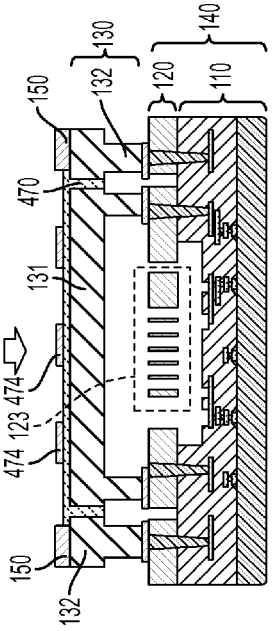

As shown in FIG. 4B, a dielectric layer 470 is formed over the cap portion 131 and conductor portions 132. In at least one embodiment, the dielectric layer 470 includes polyimide. Other materials that have resistance of at least 100 kilohm-cm are used as the dielectric layer 470 in some embodiments. In at least one embodiment, the dielectric layer 470 fills the trench 139 at least partially. In at least one embodiment, the dielectric layer 470 is deposited by spin coating.

Figure 4C:
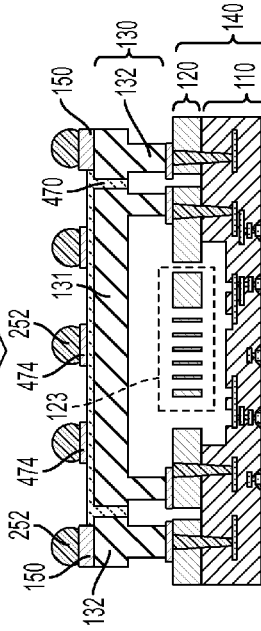

As shown in FIG. 4C, the dielectric layer 470 is patterned to expose the conductor portions 132, while still covering the cap portion 131.

Figure 4D:
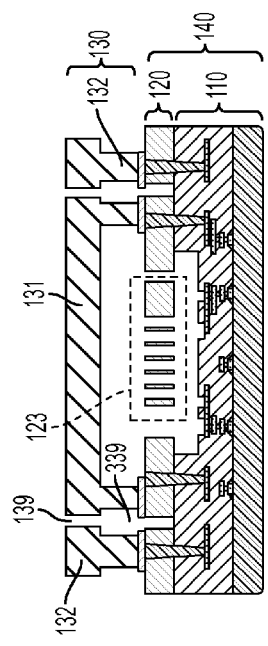

As shown in FIG. 4D, a conductive layer 472 is formed over the structure of FIG. 4C. In at least one embodiment, the conductive layer 472 includes one or more of Al, Cu, Ti, Ta, Au, or Ni deposited by sputtering.

Figure 4E:
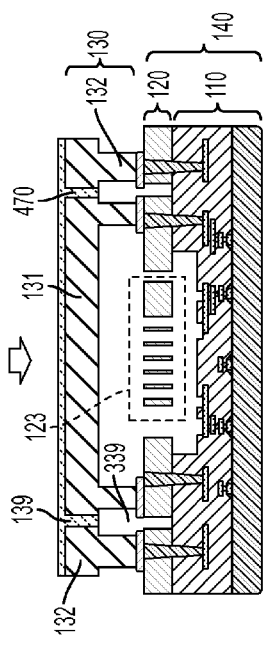

As shown in FIG. 4E, the conductive layer 472 is subsequently patterned by etching, to form contact pads 150 over the conductor portions 132, and one or more additional contact pads 474 over the dielectric layer 470 over the cap portion 131. The dielectric layer 470 electrically isolates the contact pads 474 from the conductive material of the cap portion 131. One or more of the contact pads 474 are electrically connected to one or more of the contact pads 150 to increase the I/O count and/or to provide I/Os in a less crowded region (e.g., over the cap portion 131).

Figure 4F:
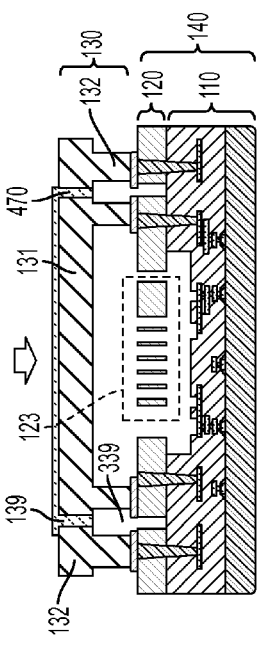

As shown in FIG. 4F, solder balls 252 and/or bonding wires are formed over the corresponding contact pads 150, 474.

FIGS. 5A-5E are schematic cross-sectional views of a semiconductor device at various stages during manufacture in accordance with some embodiments.

As shown in FIG. 5A, a structure corresponding to the semiconductor device 100 is obtained in accordance with some embodiments as described herein.

As shown in FIG. 5B, a solder mask film 580 is formed over the cap portion 131 and the conductor portions 132. The solder mask film 580 further surrounds the cap portion 131 and the conductor portions 132. In at least one embodiment, the solder mask film 580 fills the trench 139 at least partially. In at least one embodiment, the solder mask film 580 includes one or more of a resin, a polymer, polyimide, or polybenzobisoxazole (PBO).

As shown in FIG. 5C, the solder mask film 580 is patterned to expose the contact pads 150 over the conductor portions 132, while still covering the cap portion 131.

As shown in FIG. 5D, a re-distribution layer 582 is formed over the exposed contact pads 150, and over the solder mask film 580 over the cap portion 131. In at least one embodiment, the re-distribution layer 582 includes one or more of Ti, TiN, Al, Ta, or Cu deposited by sputtering or electroplating.

As shown in FIG. 5E, solder balls 252 and/or bonding wires are formed over the re-distribution layer 582 over the cap portion 131. Compared to the operations described with respect to FIGS. 2A-2G and 3A-3E, the operations in accordance with some embodiments described with respect to FIGS. 4A-4F and/or 5A-5E provide a dielectric layer over the conductive cap portion 131 and use the additional area provided by the dielectric layer over the cap portion 131 for routing and/or forming additional contact pads which increase flexibility in I/O arrangement for the semiconductor device.

Figure 6:
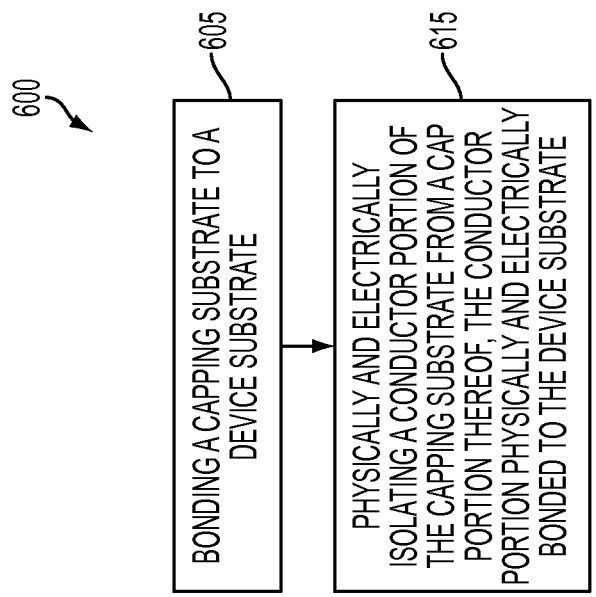
FIG. 6 is a flow chart of a method of manufacturing a semiconductor device in accordance with some embodiments.

FIG. 6 is a flow chart of a method 600 of manufacturing a semiconductor device in accordance with some embodiments. In at least one embodiment, the method 600 is arranged for manufacturing one or more semiconductor devices or structures described with respect to FIGS. 1, 2A-2G, 3A-3E, 4A-4F and 5A-5E.

At operation 605, a capping substrate is bonded to a device substrate. For example, a capping substrate 130 is bonded to a device substrate 140, as described herein with respect to FIGS. 1 and 2A-2E.

At operation 615, a conductor portion of the capping substrate is physically and electrically isolated from a cap portion of the capping substrate. For example, a conductor portion 132 of the capping substrate 130 is physically and electrically isolated from a cap portion 131 of the third substrate 130, e.g., by etching a trench 139 in the capping substrate 130. The conductor portion 132 is physically and electrically bonded to the device substrate 140, as described herein with respect to FIGS. 1 and 2F-2G.

The above method(s) include(s) example operations, but the operations in some embodiments are not performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

According to some embodiments, a semiconductor device comprises a device substrate and a conductive capping substrate. The device substrate comprises at least one micro-electro mechanical system (MEMS) device. The conductive capping substrate is bonded to the device substrate and comprises a cap portion covering the MEMS device, and a conductor portion in electrical contact with the device substrate.

According to some embodiments, a semiconductor device comprises first, second and third substrates. The first substrate comprises at least one conductive layer. The second substrate comprises at least one micro-electro mechanical system (MEMS) device, the second substrate bonded to the first substrate. The third substrate is made of doped Si and comprises a cap portion covering the MEMS device, and a Si pillar electrically connected to the at least one conductive layer.

In a method of manufacturing a semiconductor device, a capping substrate is bonded to a device substrate. The device substrate comprises at least one micro-electro mechanical system (MEMS) device. The capping substrate comprises a cap portion covering the MEMS device. A conductor portion of the capping substrate is physically and electrically isolated from the cap portion. The conductor portion is physically and electrically bonded to the device substrate.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device, comprising:
   a device substrate comprising at least one micro-electro mechanical system (MEMS) device and at least one via extending from a surface of the device substrate into a body of the device substrate by a distance, wherein the distance is less than a thickness of the device substrate; and
   a conductive capping substrate bonded to the device substrate, the conductive capping substrate comprising:
   a cap portion covering the MEMS device,
   a conductor portion in electrical contact with the at least one via, and
   a dielectric material between the cap portion and the conductor portion,
   wherein the cap portion comprises:
   a top wall overlapping the MEMS device, and
   side walls extending from opposite ends of the top wall, the side walls transverse to the top wall and connecting to the device substrate.

2. The semiconductor device of claim 1, wherein the conductive capping substrate has a resistance not greater than 1 milliohm-cm.

3. The semiconductor device of claim 2, wherein the conductive capping substrate has a Young modulus of at least 50 GPa.

4. The semiconductor device of claim 1, wherein
   the MEMS device is electrically connected to the conductor portion.

5. The semiconductor device of claim 1, wherein the device substrate further comprises an integrated circuit electrically connected to the conductor portion and the MEMS device.

6. The semiconductor device of claim 1, wherein the device substrate further comprises:

at least one dielectric layer, and at least one conductive layer in the dielectric layer, the at least one via electrically connecting the conductive capping substrate to the at least one conductive layer.

7. The semiconductor device of claim 6, wherein the device substrate further comprises:

a first substrate comprising:
an integrated circuit,
the at least one dielectric layer over the integrated circuit, and
the at least one conductive layer electrically connected to the integrated circuit, and a second substrate comprising the MEMS device, the second substrate bonded to the first substrate, the at least one via extending through the second substrate to electrically connect the conductive capping substrate and the at least one conductive layer.

8. The semiconductor device of claim 1, further comprising:
a contact pad over the conductor portion.

9. The semiconductor device of claim 1, further comprising:
a dielectric layer over the top wall of the cap portion; and
a conductive layer over the dielectric layer and electrically connected to the conductor portion, the conductive layer overlapping the top wall of the cap portion.

10. The semiconductor device of claim 1, further comprising:
a dielectric layer over the top wall of the cap portion;
at least one first contact pad over the conductor portion; and
at least one second contact pad over the dielectric layer, the at least one second contact pad overlapping the top wall of the cap portion.

11. A semiconductor device, comprising:
a first substrate comprising:
an integrated circuit,
at least one dielectric layer over the integrated circuit, and
at least one conductive layer in the at least one dielectric layer, the at least one conductive layer electrically connected to the integrated circuit;
a second substrate comprising at least one micro-electro mechanical system (MEMS) device, the second substrate bonded to the first substrate; and
a third conductive substrate bonded to the second substrate, the third conductive substrate comprising:
a cap portion covering the MEMS device,
a conductor portion electrically isolated from the cap portion and electrically connected to the first substrate, and
a dielectric material between the cap portion and the conductor portion, wherein the dielectric material extends along a top surface of the cap portion.

12. The semiconductor device of claim 11, wherein the third conductive substrate has a resistance not greater than 1 milliohm-cm.

13. The semiconductor device of claim 11, wherein the at least one dielectric layer and the at least one conductive layer are positioned between the integrated circuit and the MEMS device.

14. The semiconductor device of claim 11, wherein the integrated circuit is electrically connected to the conductor portion and the MEMS device via the at least one conductive layer.

15. A method of manufacturing a semiconductor device, the method comprising:

bonding a capping substrate to a device substrate, the device substrate comprising at least one micro-electro mechanical system (MEMS) device and at least one via extending from a surface of the device substrate into a body of the device substrate by a distance, the capping substrate comprising a cap portion covering the MEMS device, wherein the distance is less than a thickness of the device substrate;

physically and electrically isolating a conductor portion of the capping substrate from the cap portion, the conductor portion physically and electrically bonded to the at least one via; and depositing a dielectric layer over the cap portion and between the cap portion and the conductor portion, wherein the dielectric layer completely fills a space between the cap portion and the conductor portion.

16. The method of claim 15, further comprising, before said bonding:

forming a cavity and a trench in the capping substrate, wherein
the cavity corresponds to the cap portion,
the trench is positioned between the cap portion and the conductor portion,
said forming leaves a portion of the capping substrate between the cap portion and the conductor portion, the portion corresponding to the trench, and
said isolating comprises removing the portion of the capping substrate between the cap portion and the conductor portion.

17. The method of claim 15, further comprising:
forming a contact pad over the conductor portion before said isolating.

18. The method of claim 15, further comprising:
after said depositing the dielectric layer over the cap portion and between the cap portion and the conductor portion,
patterning the dielectric layer to form at least one first contact pad over the conductor portion,
forming a conductive layer over the dielectric layer and the conductor portion; and
patterning the conductive layer to form at least one second contact pad over the dielectric layer over the cap portion.

19. The method of claim 15, further comprising:
forming a contact pad over the conductor portion; wherein
said depositing the dielectric layer comprises depositing a solder mask film over the capping substrate and the contact pad; and
said method further comprises:
patterning the solder mask film to expose the contact pad over the conductor portion;
forming a re-distribution layer over the exposed contact pad and the solder mask film over the cap portion; and
printing or dropping a solder bump over the re-distribution layer over the cap portion.

20. The method of claim 15, further comprising, before said bonding the capping substrate to the device substrate:
forming an interconnect structure over an integrated circuit of a first substrate, the interconnect structure comprising at least one conductive layer electrically connected to the integrated circuit;
bonding a second substrate to the first substrate; and forming the MEMS device in the second substrate to obtain the device substrate.

* * * * *